United States Patent [19]

Bui

[11] Patent Number: 6,063,662

[45] Date of Patent: *May 16, 2000

[54] METHODS FOR FORMING A CONTROL GATE APPARATUS IN NON-VOLATILE MEMORY SEMICONDUCTOR DEVICES

[75] Inventor: Nguyen Duc Bui, San Jose, Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/993,409

[22] Filed: Dec. 18, 1997

[51] Int. Cl.[7] .................................................. H01L 29/788
[52] U.S. Cl. .......................... 438/257; 438/201; 438/211; 438/593; 257/315
[58] Field of Search ..................... 438/257, 201, 438/211, 593, 626, 627, 682; 257/239, 261, 314, 315, 317, 320, 321, 490, 495

[56] References Cited

U.S. PATENT DOCUMENTS

| 5,150,178 | 9/1992 | Mori | 257/239 |
|---|---|---|---|
| 5,156,990 | 10/1992 | Mitchell | 438/201 |
| 5,480,837 | 1/1996 | Liaw et al. | 438/626 |
| 5,973,353 | 10/1999 | Yang et al. | 257/315 |

Primary Examiner—Olik Chaudhuri
Assistant Examiner—Anh Duy Mai

[57] ABSTRACT

Methods are provided to increase the process control during the fabrication of the control gate configuration in a non-volatile memory semiconductor device. The methods effectively smooth out the top surface of the control gate layer, which allows for a subsequently formed silicide layer to be formed on the control gate layer without significant surface depressions. Significant surface depressions in either the control gate layer or the silicide layer can lead to cracking of the silicide layer during subsequent thermal processing of the semiconductor device. Thus the disclosed methods prevent cracking of the silicide layer on the control gate, which can affect the performance of the semiconductor device by increasing the resistance of the control gate arrangement.

11 Claims, 7 Drawing Sheets

METHODS FOR FORMING A CONTROL GATE APPARATUS IN NON-VOLATILE MEMORY SEMICONDUCTOR DEVICES

TECHNICAL FIELD

The present invention relates to semiconductor devices and manufacturing processes, and more particularly to methods and apparatus associated with non-volatile memory semiconductor devices.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit line and a word line and erased together as a block. An example of a memory of this type includes individual metal oxide semiconductor (MOS) memory cells, each of which includes a source, drain, floating gate, and control gate to which various voltages are applied to program the cell with a binary 1 or 0. Each memory cell can be read by addressing it via the appropriate word and bit lines.

Figure 1A:
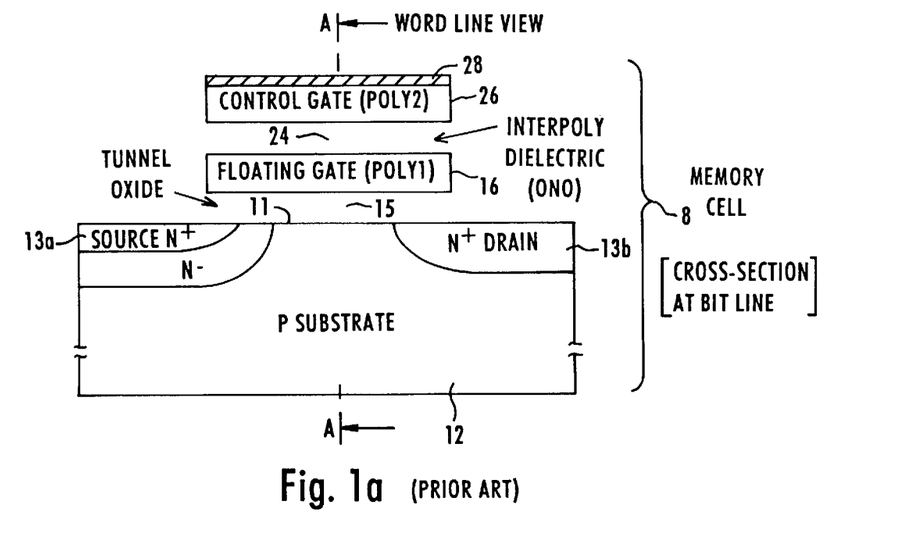
FIGS. 1a–b depict different cross-sectional views of portions of a typical prior art semiconductor device having at least one memory cell.

An exemplary memory cell 8 is depicted in FIG. 1a. As shown, memory cell 8 is viewed in a cross-section through the bit line. Memory cell 8 includes a doped substrate 12 having a top surface 11, and within which a source 13a and a drain 13b have been formed by selectively doping regions of substrate 12. A tunnel oxide 15 separates a floating gate 16 from substrate 12. An interpoly dielectric 24 separates floating gate 16 from a control gate 26. Floating gate 16 and control gate 26, are each electrically conductive and typically formed of polysilicon.

On top of control gate 26 is a silicide layer 28, which acts to increase the electrical conductivity of control gate 26. Silicide layer 28 is typically a tungsten silicide (e.g., $WSi_2$), that is formed on top of control gate 26 prior to patterning, using conventional deposition and annealing processes.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate does not contain a threshold level of electrical charge, then floating gate 16 represents a binary 0. During erasure, the charge is removed from floating gate 16 by way of the erasure voltage applied to source 13a.

Figure 1B:
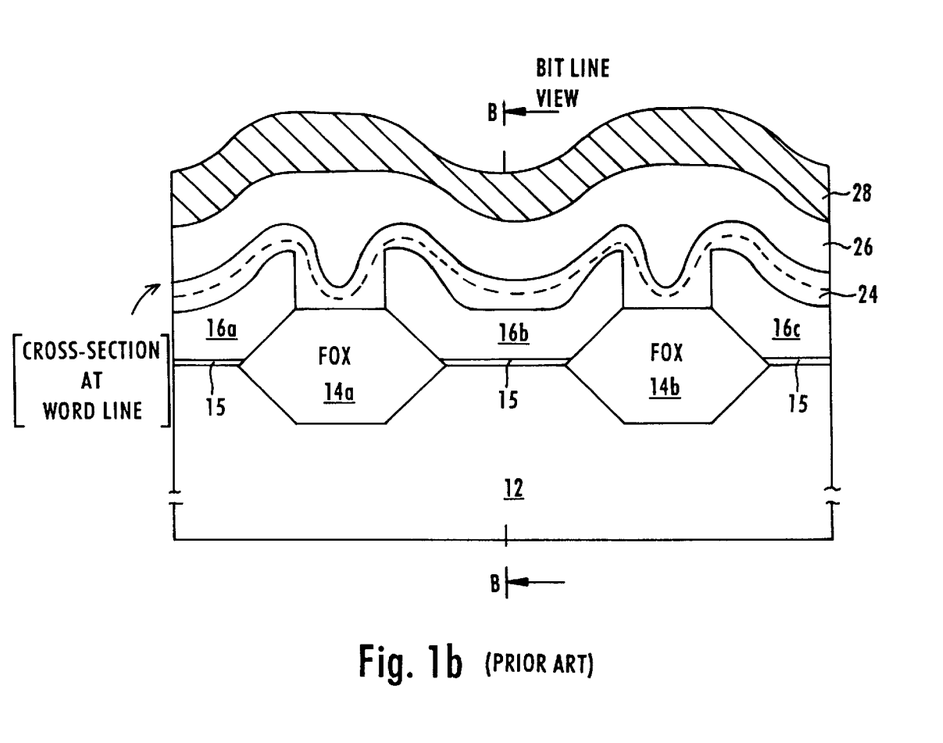

FIG. 1b depicts a cross-section of several adjacent memory cells from the perspective of a cross-section through the word line (i.e., from perspective A, as referenced in FIG. 1a). In FIG. 1b, the cross-section reveals that individual memory cells are separated by isolating regions of silicon dioxide formed on substrate 12. For example, FIG. 1b shows a portion of a floating gate 16a associated with a first memory cell, a floating gate 16b associated with a second memory cell, and a floating gate 16c associated with a third memory cell. Floating gate 16a is physically separated and electrically isolated from floating gate 16b by a field oxide (FOX) 14a that forms an isolating region. Floating gate 16b is separated from floating gate 16c by a field oxide 14b. Floating gates 16a, 16b, and 16c are typically formed by selectively patterning a single conformal layer of polysilicon that was deposited over the exposed portions of substrate 12, tunnel oxide 15, and field oxides 14a–b. Interpoly dielectric layer 24 has been conformally deposited over the exposed portions of floating gates 16a–c and field oxide regions 14a–b. Interpoly dielectric layer 24 isolates floating gates 16a–c from the next conformal layer which is typically a polysilicon layer that is patterned (e.g., along the bit line) to form control gate 26. Interpoly dielectric layer 24 typically includes a plurality of films, such as, for example, a bottom film of silicon dioxide, a middle film of silicon nitride, and a top film of silicon dioxide. This type of interpoly dielectric layer is commonly referred to as an oxide-nitride-oxide (ONO) layer.

The continued shrinking of the memory cells, and in particular the features depicted in the memory cells of FIGS. 1a–b, places a burden on the fabrication process to deposit/form the floating gate 16 and control gate 26 without creating deleterious effects within the memory cell. Of particular concern caused by the shrinking dimensions is the need to provide adequate isolation between each of the floating gates 16a–c, and between each of the floating gates 16a–c and control gate 26, while also providing an adequately arranged floating/control gate configuration.

SUMMARY OF THE INVENTION

These needs and others are met by the present invention, which provides methods that increase the process control during the fabrication of semiconductor devices, and in particular, during the formation of the control gate configuration in a non-volatile memory semiconductor device.

In accordance with one aspect of the present invention, it has been found that, in certain semiconductor arrangements, the topology created by the space between adjacent floating gates (e.g., 16a and 16b), can be so severe in shape (e.g., deep and narrow) that the silicide layer 28 formed on the overlying control gate 26 often contains significant depressions over the space. These significant depressions can lead to cracks in the silicide layer 28 during subsequent thermal processing of the semiconductor device, which tends to stress the silicide layer 28.

In accordance with one aspect of the present invention, the top of the conformal polysilicon layer, from which control gate 26 is formed, is smoothed to produce a more planar surface on which the silicide layer 28 is then formed. Thus, regardless of the underlying topology the control gate 26 and suicide layer 28 will be substantially free of depressions. Consequently, cracking of silicide layer 28 is substantially less likely to occur during the subsequent thermal processes.

Thus, in accordance with one embodiment of the present invention, a method is provided that includes the steps of forming at least two isolating regions, separated by an isolated region, within a substrate, forming a tunnel oxide on the top surface of the substrate and within the isolated region, and forming a floating gate on at least a portion of the tunnel oxide. The method includes the steps of forming a dielectric layer on the floating gate and at least a portion of each of the two isolating regions. The method further includes the steps of forming a control gate layer of a first thickness on the dielectric layer, and removing a portion of the control gate layer. As a result, the control gate layer will have a second thickness that is less than the first thickness. The method also includes forming a silicide layer on at least a portion of the control gate layer, and patterning the silicide and control gate layer to form a control gate arrangement.

In certain embodiments of the present invention, the step of forming a control gate layer of a first thickness further includes forming the control gate layer using a continuous deposition process. In still other embodiments of the present invention, the step of forming a control gate layer further includes forming the control gate layer using a non-continuous deposition process. For example in one preferred embodiment, the non-continuous deposition process includes forming a first portion of the control gate layer, performing a cool down process, and forming a second portion of the control gate layer.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

Figure 2A:
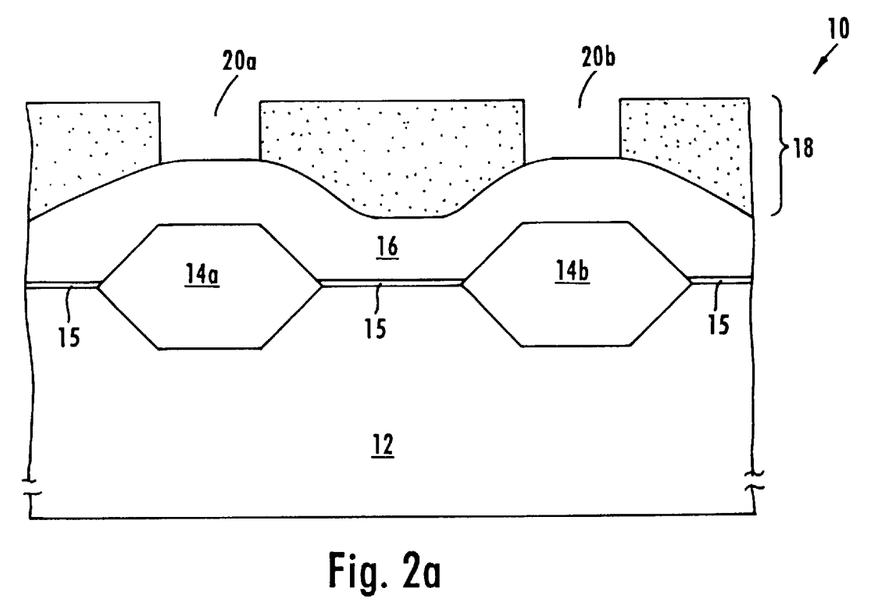
FIGS. 2a–2e sequentially depict cross-sectional views of a portion of a semiconductor device during the formation of a plurality of memory cells, which results in at least one of the memory cells having a control gate arrangement with a damaged or cracked silicide layer.

FIG. 2a represents a portion 10 of a semiconductor device as viewed from a cross-sectional perspective through the word line (similar to FIG. 1b). Portion 10, in FIG. 2a, depicts the formation of floating gates 16a–c from at least one layer of polysilicon. As shown, a conformal polysilicon layer 16 has been formed over substrate 12, tunnel oxide 15, and field oxides 14a–b. Polysilicon layer 16 can be deposited, for example, using conventional deposition techniques, such as, chemical vapor deposition (CVD) or plasma enhanced CVD (PECVD) techniques. To pattern polysilicon layer 16 into floating gates 16a–16c (see FIG. 2b) a mask 18 has been formed and patterned on polysilicon layer 16. Mask 18, which is typically a lithographic mask, includes openings 20a–20b that selectively exposed portions of the underlying polysilicon layer 16. The formation of floating gates 16a–16c includes reactive ion etching (RIE) or plasma etching processes that remove the exposed portions of polysilicon layer 16 through openings 20a–b, and stop on field oxides 14a–b.

Figure 2B:
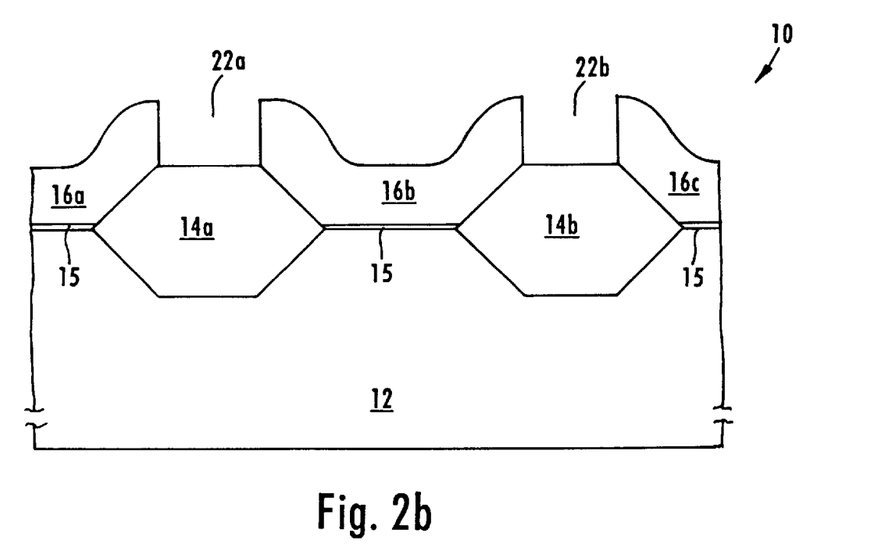

In FIG. 2b, portion 10 has been etched and mask 18 has been stripped away, for example, using conventional stripping techniques, leaving floating gates 16a–c. The etching process creates spaces 22a and 22b. Spaces 22a–22b tend to be relatively narrow in width. For example, in sub-micron flash memories, spaces 22a and 22b can be between about 0.1 and 0.4 microns. Floating gates 16a–c are typically about 900 to 1,100 Angstroms thick. Consequently, the critical dimension of spaces 22a–b represents a significantly severe topology over which the subsequent layers are formed (e.g., interpoly dielectric layer 24, control gate 26 and silicide layer 28).

Figure 2C:
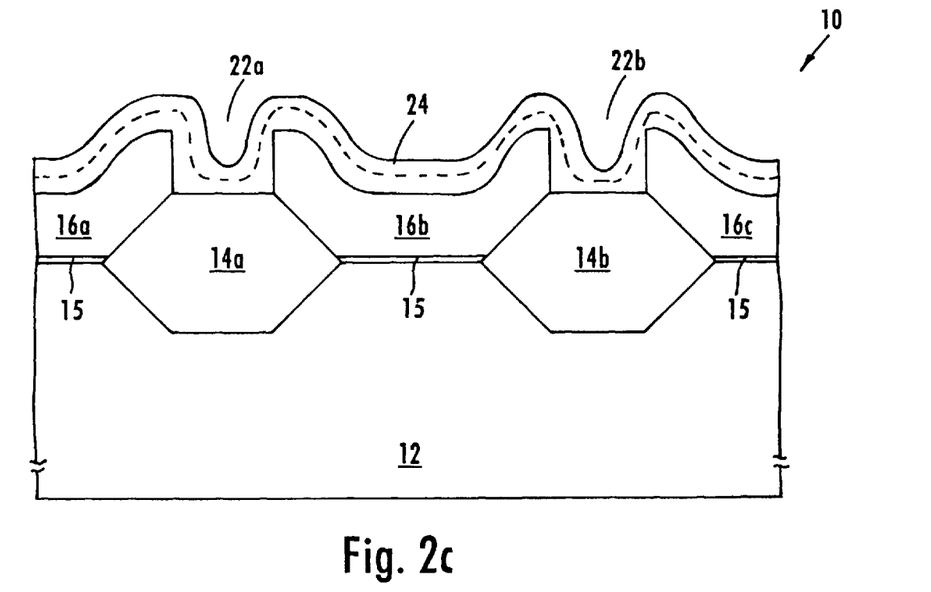

FIG. 2c depicts the portion 10 of FIG. 2b following deposition of interpoly dielectric layer 24 over floating gates 16a–c and within spaces 22a and 22b (see FIG. 2b). In certain preferred embodiments of the present invention, interpoly dielectric layer 24 is an ONO layer. An ONO layer can be formed, for example, by a three stage process in which a first film of silicon dioxide (e.g., about 50 Angstroms thick) is deposited or grown, followed by deposition of a second film of silicon nitride (e.g., about 80 Angstroms thick), and then a third film of silicon dioxide (e.g., about 40 Angstroms thick) is deposited or grown. The ONO layer provides a thin highly-insulative dielectric layer that separates the floating gate 16 from the control gate 26, as depicted in FIG. 2d.

Figure 2D:
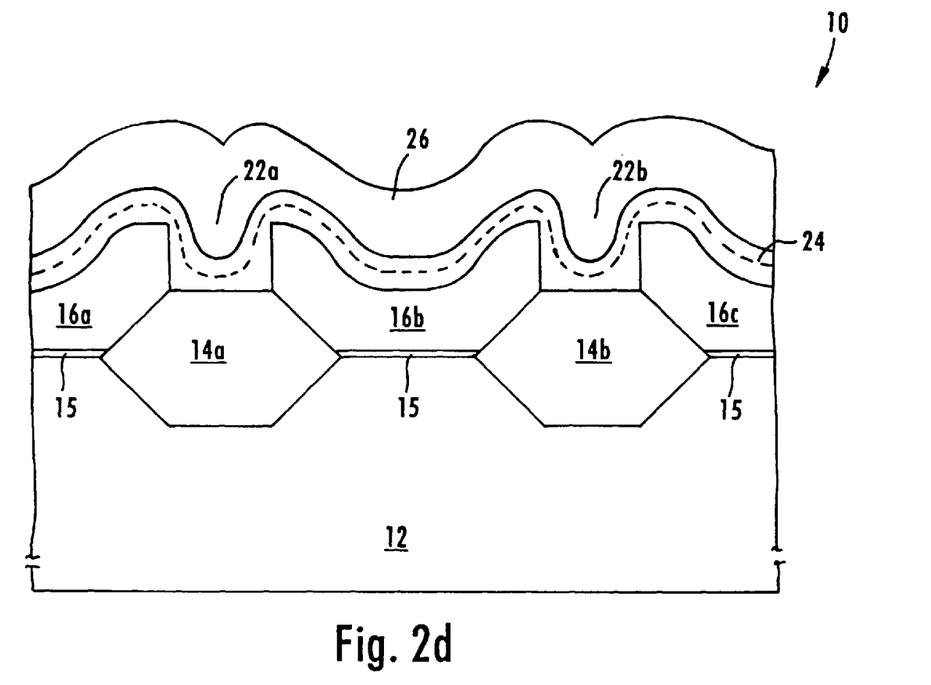
Figure 2E:
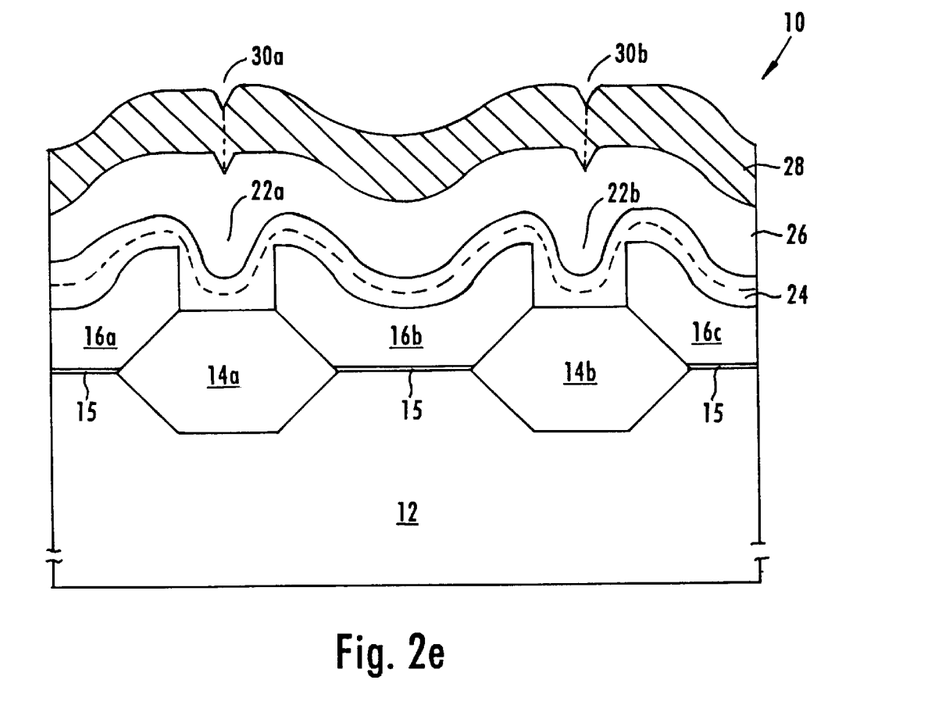

In FIG. 2d, the portion 10 of FIG. 2c has been further processed to include a conformal layer of polysilicon that is patterned to form the control gate 26. This polysilicon can be deposited to a thickness of about 1,200 Angstroms using conventional deposition techniques, such as, CVD and PECVD techniques. A silicide layer 28, for example tungsten silicide (e.g., $WSi_2$), is then formed on top of the polysilicon, as depicted in FIG. 2e. Although not visible from the word line cross-sectional perspective of FIG. 2d, the polysilicon is then selectively patterned using conventional polysilicon etching processes to form control gate 26.

Silicide layer 28 increases the conductivity of the control gate 26 and is designed to carry a significant portion of the programming current during the programming of the memory cells. It has been found, however, that silicide layer 28 can develop cracks, such as cracks 30a–30b in FIG. 2e, during subsequent thermal processing of portion 10. Cracks 30a–30b can extend partially through silicide layer 28, or in some cases can extend all the way through silicide layer 28 to control gate 26.

The cracking of silicide layer 28 appears to be caused by a combination of the severe topology of the spaces 22a–b (see FIG. 2b) and the subsequent thermal processing which typically is required to complete the manufacturing process. For example, subsequent thermal processes can include a high voltage anneal or thermal oxidation process associated with subsequent manufacturing steps. Thus, silicide layer 28, when subjected to the high temperatures of the subsequent thermal processes, tends to crack above the sever topology of the underlying layers. Cracks, such as, for example cracks 30a and 30b in FIG. 2e, tend to increase the resistance in the control gate 26 which can degrade the performance of the flash memory and/or damage the semiconductor device.

It has been found that the cracking of silicide layer 28 is more prominent when the spaces 22a–b between the floating gates 16a–c are less than approximately 0.4 microns. In certain preferred embodiments of the present invention, spaces 22a–b are each approximately 0.26 microns wide, and the thickness of each of the floating gates 16a–c is approximately 900 to 1,100 Angstroms. The resulting topology has been found to cause a significant amount of cracking of silicide layer 28 during subsequent thermal processing. By way of example, in certain situations the cracking of silicide layer 28 has caused the resistance of a word line to increase by 100 times.

In accordance with certain embodiments of the present invention, the cracking of silicide layer 28 is substantially reduced, if not entirely eliminated, by smoothing out the shape of the exposed surface of control gate 26 prior to forming silicide layer 28. This allows for increased step coverage when forming silicide layer 28, because the depressions attributable to the underlying severe topology have been significantly reduced in size.

Figure 3A:
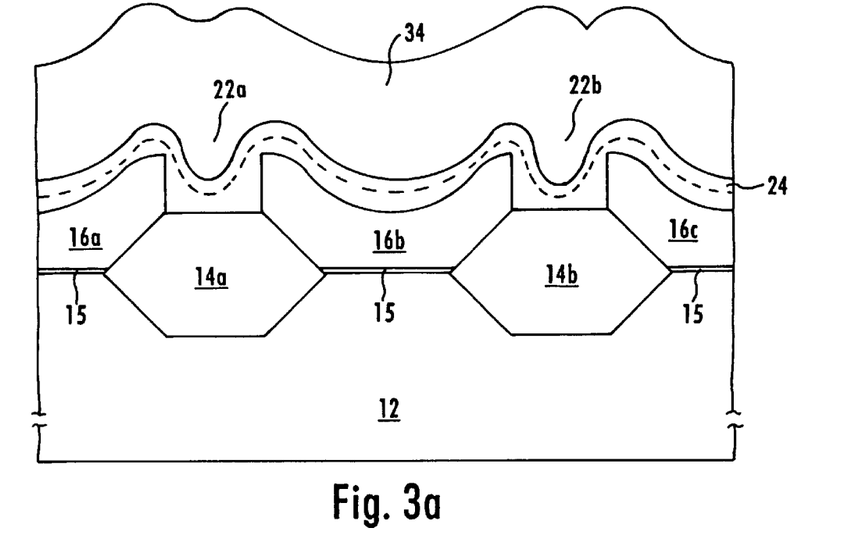
FIG. 3a depicts a cross-sectional view of a portion of a semiconductor device having a plurality of memory cells having a control gate layer of an initial thickness, in accordance with one embodiment of the present invention.

FIG. 3a depicts one embodiment of the present invention in which the portion 10 has an initial control gate layer 34 deposited over interpoly dielectric 24. Initial control gate layer 34, which preferably includes polysilicon, is deposited using conventional deposition techniques to an initial thickness that is greater than a desired final thickness. For example, in certain embodiments, initial control gate layer 34 is deposited to a thickness of between about 1,800 and 2,600 Angstroms using a CVD deposition process.

Figure 3B:
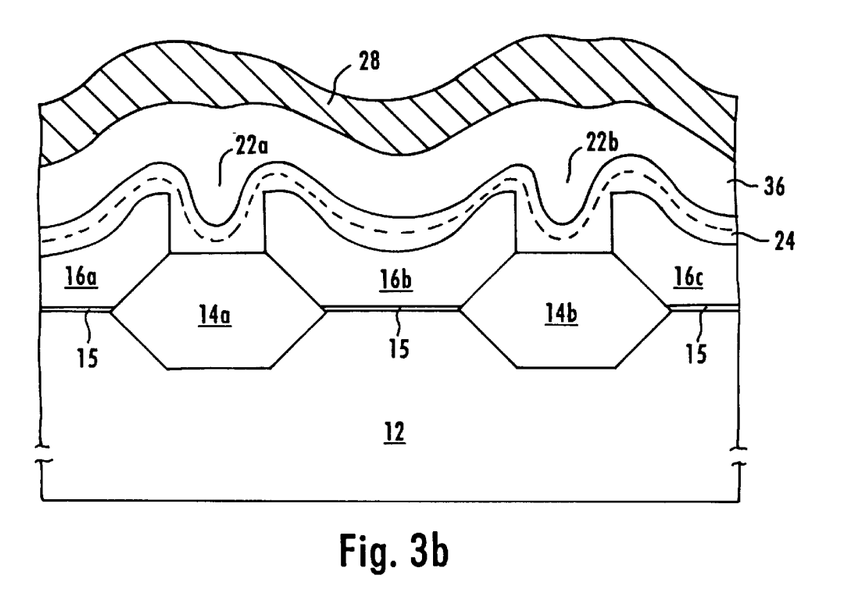
FIG. 3b depicts a cross-sectional view of the portion from FIG. 3a after a portion of the control gate layer has been removed leaving the control gate layer having a final thickness, and after a silicide layer has been formed on the control gate layer, in accordance with one embodiment of the present invention.

Next, as depicted in FIG. 3b, a portion of initial control gate layer 34 has been removed to form a final control gate layer 36 of a final thickness that is less than the initial thickness. In certain embodiments, for example, the final thickness is between about 800 and 1,400 Angstroms, but could be more or less. For example, in certain embodiments, an initial control gate layer having an initial thickness of about 2,000 Angstroms is etched using conventional etching techniques, such as, for example, a dry plasma etching process, which produces a smoother final control gate layer 36 having a thickness of about 1,200 Angstroms. The resulting final control gate 36 has only minor depressions because of the smoothing out caused by etching process. A silicide layer 28, having only minor depressions, is then formed on final control gate layer 36. Next, silicide layer 28 and final control gate layer 36 are patterned into a control gate arrangement using conventional processes.

Figure 4A:
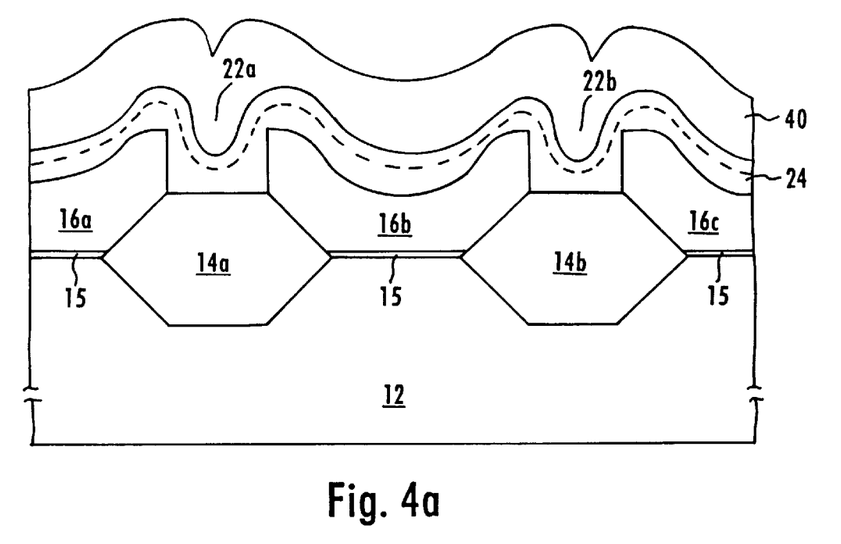
FIG. 4a depicts a cross-sectional view of a portion of a semiconductor device having a plurality of memory cells having a control gate layer of a desired thickness, in accordance with one embodiment of the present invention.
Figure 4B:
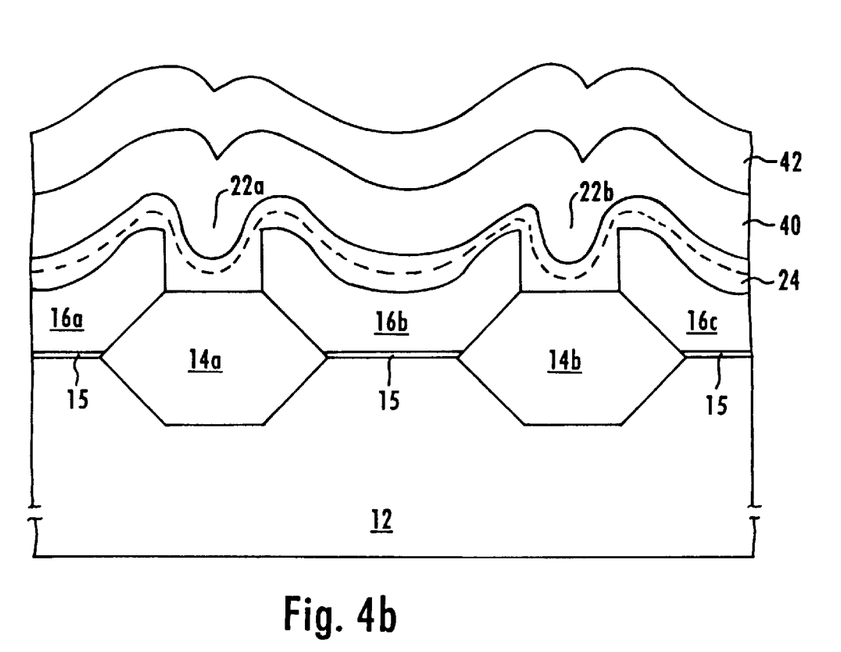
FIG. 4b depicts a cross-sectional view of the portion from FIG. 4a after an additional control gate layer material has been deposited on the control gate layer, in accordance with one embodiment of the present invention.

Another embodiment of the present invention is depicted at various stages of formation in FIGS. 4a–d. In FIG. 4a, a control gate layer 40 of a desired thickness has been deposited, using conventional techniques, on interpoly dielectric layer 24. In certain preferred embodiments, for example, the desired thickness is about 1,200 Angstroms. Next, as depicted in FIG. 4b, additional control gate layer material 42 is deposited on control gate layer 40, again using conventional deposition techniques. In certain embodiments, for example, the additional control gate layer material 42 comprises polysilicon and is about 1,200 Angstroms thick.

In certain preferred embodiments, control gate layer 40 and additional control gate layer material 42 are each deposited using an in-situ process that includes a cool down period (e.g., about 2 or more minutes) following deposition of control gate layer 40, but prior to the deposition of additional control gate layer material 42. The cool down period appears to advantageously increase the flow and/or coverage of the additional control gate layer material 42 during deposition. In certain embodiments, the cool down period includes exposing control gate layer 40 to air or other gases, which can also allow a thin layer (e.g., 10–15 Angstroms) of oxide to build up on the exposed surfaces of control gate layer 40.

Figure 4C:
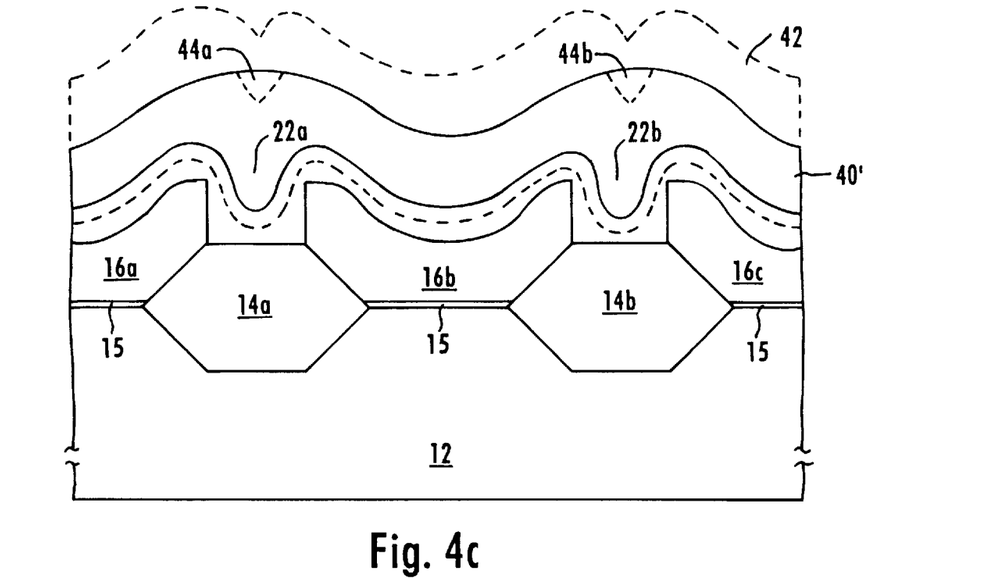
FIG. 4c depicts a cross-sectional view of the portion from FIG. 4b after a portion of the additional control gate layer material has been removed leaving the control gate layer having a final thickness, in accordance with one embodiment of the present invention.
Figure 4D:
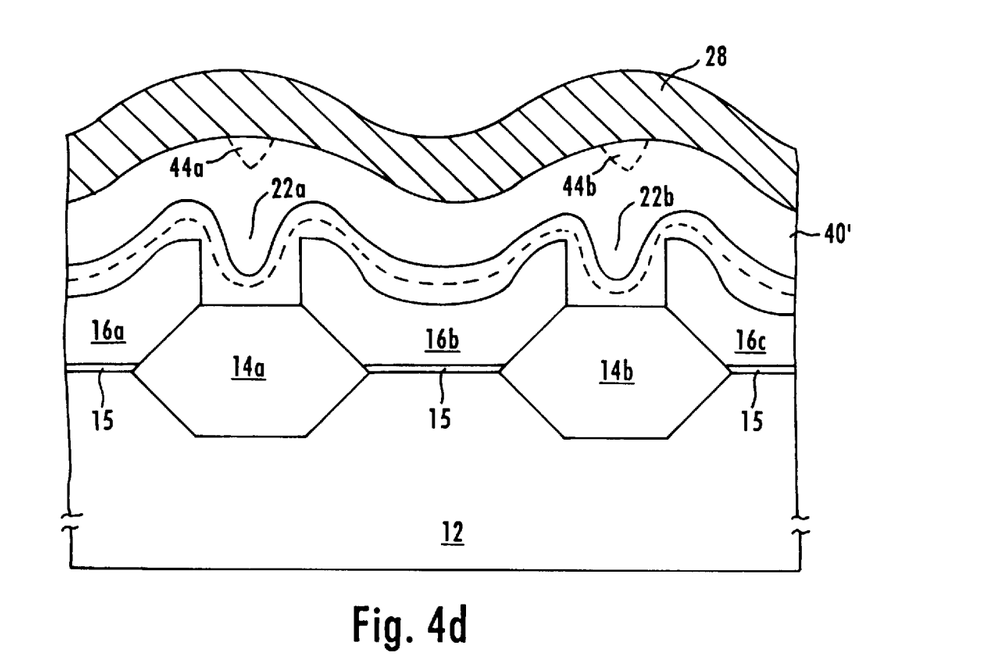
FIG. 4d depicts a cross-sectional view of the portion from FIG. 4c after a silicide layer has been formed on the control gate layer, in accordance with one embodiment of the present invention.

In FIG. 4c, a portion of the additional control gate layer material 42 has been etched back, for example, using conventional etching processes. As a result, portions of the additional control gate layer material 42 are left in place within the depressions 44a and 44b of control gate layer 40, thereby forming a filled control gate layer 40'. In certain preferred embodiments, filled control gate layer 40' has a thickness of about 1,200 Angstroms. As shown in FIG. 4d, a silicide layer 28 without significant depressions is then formed on filled control gate layer 40', using conventional processes.

Although the present invention has been described and illustrated in detail, it is to be clearly understood that the same is by way of illustration and example only and is not be taken by way of limitation, the spirit and scope of the present invention being limited only by the terms of the appended claims.

What is claimed is:

1. A method for fabricating a semiconductor device including a metal silicide layer having a reduced potential for cracking, the method comprising the sequential steps of:

forming, within a semiconductor substrate, at least two isolating regions, separated by an isolated region;

forming a floating gate layer over the substrate;

forming a dielectric layer on the floating gate layer and on at least a portion of each of the two isolating regions;

forming a control gate layer having a first predetermined thickness on at least a portion of the dielectric layer and at least partially located directly over at least a portion of the floating gate layer, wherein the step of forming the control gate layer comprises a non-continuous deposition process comprising:

forming a first, lower portion of the control gate layer on at least a portion of the dielectric layer and at least partially located directly over at least a portion of the floating gate layer, the first, lower portion having a preselected thickness;

allowing the first, lower portion to cool down for a predetermined period of time, thereby increasing the flow and/or coverage of a second, upper portion of the control gate layer deposited thereon in a following step; and forming the second, upper portion of the control gate layer over the first, lower portion of the control gate layer, the second, upper portion having a preselected thickness substantially equal to that of the first, upper portion;

removing part of the second, upper portion of the control gate layer to achieve a predetermined second thickness of the control gate layer which is less than the predetermined first thickness and sufficient to remove any depressions in the surface thereof and reduce cracking of a silicide layer formed to overlie the control gate layer in a subsequent step;

forming the silicide layer on at least a portion of the reduced thickness control gate layer; and patterning the silicide and control gate layer to form a control gate arrangement.

2. The method as recited in claim 1, wherein the preselected thickness of each of the first, lower and second, upper portions of the control gate layer is about 1,200 Å.

3. The method as recited in claim 1, wherein the control gate layer comprises polysilicon.

4. The method as recited in claim 1, wherein the first predetermined thickness of the control gate layer is between about 1,800 and about 2,600 Angstroms.

5. The method as recited in claim 1, wherein the second predetermined thickness of the control gate layer is between about 800 and about 1,400 Angstroms.

6. The method as recited in claim 1, wherein the silicide comprises tungsten.

7. The method as recited in claim 1, wherein the step of forming the floating gate further comprises forming the floating gate on at least a portion of one of the isolating regions.

8. The method as recited in claim 1, wherein at least one of the isolating regions comprises silicon dioxide.

9. The method as recited in claim 1, wherein the period of time is at least about 2 minutes.

10. The method as recited in claim 1, wherein the floating gate has a thickness that is less than about 900 Angstroms.

11. The method as recited in claim 1, wherein the step of removing includes etching the control gate layer.

* * * * *